(12) United States Patent
Bontekoe et al.

(10) Patent No.: US 7,317,510 B2
(45) Date of Patent: Jan. 8, 2008

(54) LITHOGRAPHIC APPARATUS AND DEVICE MANUFACTURING METHOD

(75) Inventors: Marcel Bontekoe, Veldhoven (NL); Patricius Aloysius Jacobus Tinnemans, Hapert (NL); Lambertus Gerardus Maria Kessels, Aalst-Waalre (NL); Marco Cornelis Jacobus Martinus Van Hassel, Zundert (NL); Wouter Frans Willem Mulckhuyse, Bussum (NL)

(73) Assignee: ASML Netherlands B.V., Veldhoven (NL)

( * ) Notice: Subject to any disclaimer, the term of this patent is extended or adjusted under 35 U.S.C. 154(b) by 268 days.

(21) Appl. No.: 11/020,643

(22) Filed: Dec. 27, 2004

(65) Prior Publication Data

US 2006/0139980 A1    Jun. 29, 2006

(51) Int. Cl.
*G03B 27/54* (2006.01)
*G03B 27/42* (2006.01)

(52) U.S. Cl. .......................................... 355/67; 355/53
(58) Field of Classification Search ................ 355/53, 355/67–71, 77; 430/5, 20, 30; 359/224
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |

(Continued)

FOREIGN PATENT DOCUMENTS

WO    WO98/33096    7/1998

(Continued)

OTHER PUBLICATIONS

Search and Examination Report for Singapore Patent Application No. 200507862-1, dated Feb. 23, 2007, 8 pages.

(Continued)

*Primary Examiner*—Henry Hung Nguyen
(74) *Attorney, Agent, or Firm*—Sterne, Kessler, Goldstein & Fox P.L.L.C.

(57) ABSTRACT

A lithography apparatus including a projection system configured to project a beam of radiation as an array of sub-beams of radiation and an array of individually controllable elements configured to modulate the sub-beams of radiation to form a requested dose pattern on a substrate. The requested dose pattern is built up over time from an array of localized exposures in which at least neighboring localized exposures are imaged at substantially different times and in which each localized exposure is produced by one of the sub-beams of radiation. The lithography apparatus also includes a rasterizer device arranged to convert data defining the requested dose pattern to a sequence of data representing the requested dose at a corresponding sequence of points within the pattern, and also a data manipulation device arranged to receive the sequence of data and constitute a control signal suitable for controlling the array of individually controllable elements.

10 Claims, 6 Drawing Sheets

U.S. PATENT DOCUMENTS

| | | |
|---|---|---|
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,886,154 B2 | 4/2005 | Okuyama |
| 7,050,155 B2 * | 5/2006 | Case et al. .................. 355/77 |
| 7,126,672 B2 * | 10/2006 | Tinnemans et al. ........... 355/67 |
| 2003/0031365 A1 | 2/2003 | Okuyama |
| 2003/0128347 A1 | 7/2003 | Case et al. |
| 2004/0041104 A1 | 3/2004 | Liebregts et al. |
| 2004/0130561 A1 | 7/2004 | Jain |
| 2005/0007572 A1 | 1/2005 | George et al. |
| 2006/0055903 A1 | 3/2006 | Thuren et al. |

FOREIGN PATENT DOCUMENTS

| | | |
|---|---|---|
| WO | WO98/38597 | 9/1998 |
| WO | WO 03/023488 A1 | 3/2003 |
| WO | WO 2003/081338 A1 | 10/2003 |
| WO | WO 2006/007536 A1 | 1/2006 |

OTHER PUBLICATIONS

Patent Abstracts of Japan, JP 2003-057837 A (PENTAX CORP), Feb. 28, 2003, 1 page.

Search and Examination Report for European Patent Application No. 05257659.2-1226, mailed May 24, 2007, search completion date May 8, 2007, 9 total pages.

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate (e.g., a workpiece, an object, a display, etc.). The lithographic apparatus can be used, for example, in the manufacture of integrated circuits (ICs), flat panel displays, and other devices involving fine structures. In a conventional lithographic apparatus, a patterning means, that is alternatively referred to as a mask or a reticle, can be used to generate a circuit pattern corresponding to an individual layer of the IC (or other device), and this pattern can be imaged onto a target portion (e.g., comprising part of a die, one die, or several dies) on a substrate (e.g., a silicon wafer or glass plate) that has a layer of radiation-sensitive material (e.g., resist). Instead of a mask, the patterning means can comprise an array of individually controllable elements that generate the circuit pattern. Lithographic systems utilizing such arrays are generally described as maskless systems.

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning" direction), while synchronously scanning the substrate parallel or anti-parallel to this direction.

The product pattern to be created on the substrate can be defined using a vector design package, according to a Graphic Design System II (GDSII) format, for example. In a maskless system, the output file from such a design package is processed to derive a control signal that is sent via a data path, which can comprise further processing stages, to the array of individually controllable elements. The control signal contains information to manage switching of each element of the array of individually controllable elements for each flash of the radiation to be patterned by the array (typical strobe frequencies being in the region of 50 kHz for this application). The bandwidth required to transfer such a volume of data can be enormous. The situation worsened by the data conversion and optimization processing that takes place in the data path (i.e., between the output file and the array of individually controllable elements). These data processing steps are often implemented during imaging (to avoid having to store vast volumes of data off-line and to allow response to changes in apparatus conditions) and require access to portions of the data being transmitted to the array of individually controllable elements. High speed processing means and further high bandwidth connections need to be incorporated into the data path to accommodate the abovementioned data processing leading to further increases in costs and/or limits on the speed and accuracy with which the requested image can be written to the substrate.

Therefore, what is needed is a lithography apparatus and device manufacturing method that makes more efficient use of the bandwidth available in the data path in maskless lithography systems.

SUMMARY OF THE INVENTION

According to an embodiment, there is provided a lithography apparatus that includes a projection system, an array of individually controllable elements, a rasterizer device, and a data manipulation device. The projection system is configured to project a beam of radiation onto a substrate as an array of sub-beams of radiation. The array of individually controllable elements is configured to modulate the sub-beams of radiation so as substantially to form a requested dose pattern on the substrate. The requested dose pattern is built up over time from an array of localized exposures in which at least neighboring localized exposures are imaged at substantially different times and in which each localized exposure is produced by one of the sub-beams of radiation. The rasterizer device is arranged to convert data defining the requested dose pattern to a sequence of data representing the requested dose at a corresponding sequence of points within the pattern. The data manipulation device is arranged to receive the sequence of data and constitute a control signal therefrom suitable for controlling the array of individually controllable elements. The data manipulation device is configured to calculate a desired sub-beam intensity for each localized exposure so as to reproduce the requested dose pattern. For each localized exposure, the calculation is based on context information comprising the requested dose pattern in a region on the substrate around the localized exposure. The data manipulation device includes a memory buffer arranged to store a portion of the sequence of data. The data manipulation device also includes a desired sub-beam intensity calculation device configured to calculate the desired sub-beam intensity for a plurality of neighboring localized exposures based on context information provided by the memory buffer.

According to another embodiment, there is provided a device manufacturing method, including the steps of projecting a beam of radiation onto a substrate as an array of sub-beams of radiation and modulating the sub-beams of radiation with an array of individually controllable elements so as substantially to form a requested dose pattern on the substrate. The requested dose pattern is built up over time from an array of localized exposures in which at least neighboring localized exposures are imaged at substantially different times and in which each localized exposure is produced by one of the sub-beams of radiation. The method further includes the steps of converting data defining the requested dose pattern to a sequence of data representing the requested dose at a corresponding sequence of points within the pattern, receiving the sequence of data at a data manipulation device, constituting a control signal at the data manipulation device suitable for controlling the array of individually controllable elements, and calculating at the data manipulation device a desired sub-beam intensity for each localized exposure so as to reproduce the requested dose pattern. For each localized exposure, the calculation is based on context information comprising the requested dose pattern in a region on the substrate around the localized exposure. The data manipulation device includes a memory buffer arranged to store a portion of the sequence of data. The data manipulation device also includes a desired sub-beam intensity calculation device configured to calculate the desired sub-beam intensity for a plurality of neighboring localized exposures based on context information provided by the memory buffer.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION OF THE INVENTION

Overview And Terminology

Figure 1:
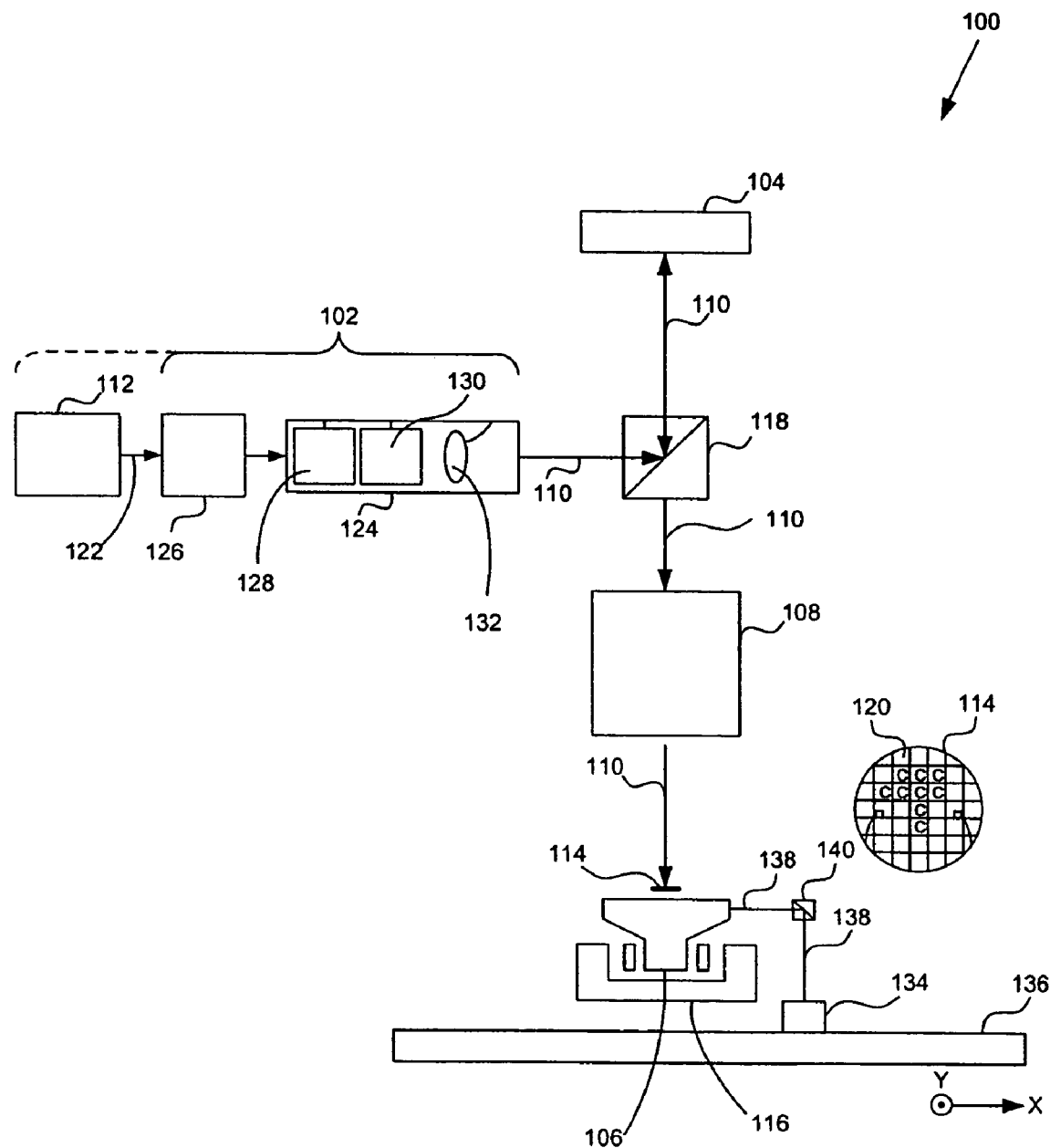
FIG. 1 depicts a lithographic apparatus according to an embodiment of the invention.

Although specific reference can be made in this text to the use of lithographic apparatus in the manufacture of integrated circuits (ICs), it should be understood that the lithographic apparatus described herein can have other applications, such as, for example, the manufacture of DNA chips, micro-electromechanical systems (MEMS), micro-optical-electromechanical systems (MOEMS), integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the filter can filter out the diffracted light, leaving the undiffracted light to reach the substrate. In this manner, the beam becomes patterned according to the addressing pattern of the matrix addressable surface. It will be appreciated that, as an alternative, the undiffracted light can be filtered out of the reflected beam, leaving the diffracted light to reach the substrate. An array of diffractive optical micro-electricalmechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors that can each be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors. In this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, that are incorporated herein by reference in their entireties. A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 408, 355, 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more object (or substrate) tables (and/or two or more mask tables). In such "multiple stage" machines the additional tables can be used in parallel, or preparatory steps can be carried out on one or more tables while one or more other tables are being used for exposure.

The lithographic apparatus can be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the programmable mask (i.e., the array of controllable elements) and the first element of the projection system and/or between the first element of the projection system and the substrate. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114, as is discussed in more detail below.

Source 112 (e.g., a frequency tripled Nd: YAG laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

It should be noted, with regard to FIG. 1, that source 112 can be within the housing of lithographic projection apparatus 100. In alternative embodiments, source 112 can also be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), object table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, object table 106 can be fixed, with substrate 114 being moveable over object table 106. Where this is done, object table 106 is provided with a multitude of openings on a flat uppermost surface, gas being fed through the openings to provide a gas cushion which is capable of supporting substrate 114. This is conventionally referred to as an air bearing arrangement. Substrate 114 is moved over object table 106 using one or more actuators (not shown), which are capable of accurately positioning substrate 114 with respect to the path of beam 110. Alternatively, substrate 114 can be moved over object table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus can be used in five modes:

1. Step mode: the entire pattern on the array of individually controllable elements 104 is projected in one go (i.e., a single "flash") onto a target portion 120. Object table 106 is then moved in the X and/or Y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is moveable in a given direction (the "scan direction," e.g., the Y direction) with a speed v, so that patterned beam 110 is caused to scan over the array of individually controllable elements 104. Concurrently, object table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Object table 106 is moved with an essentially constant speed such that patterned beam 110 is caused to scan a line across substrate 114. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially a same shape. One substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Imaging Systems

Figure 2:
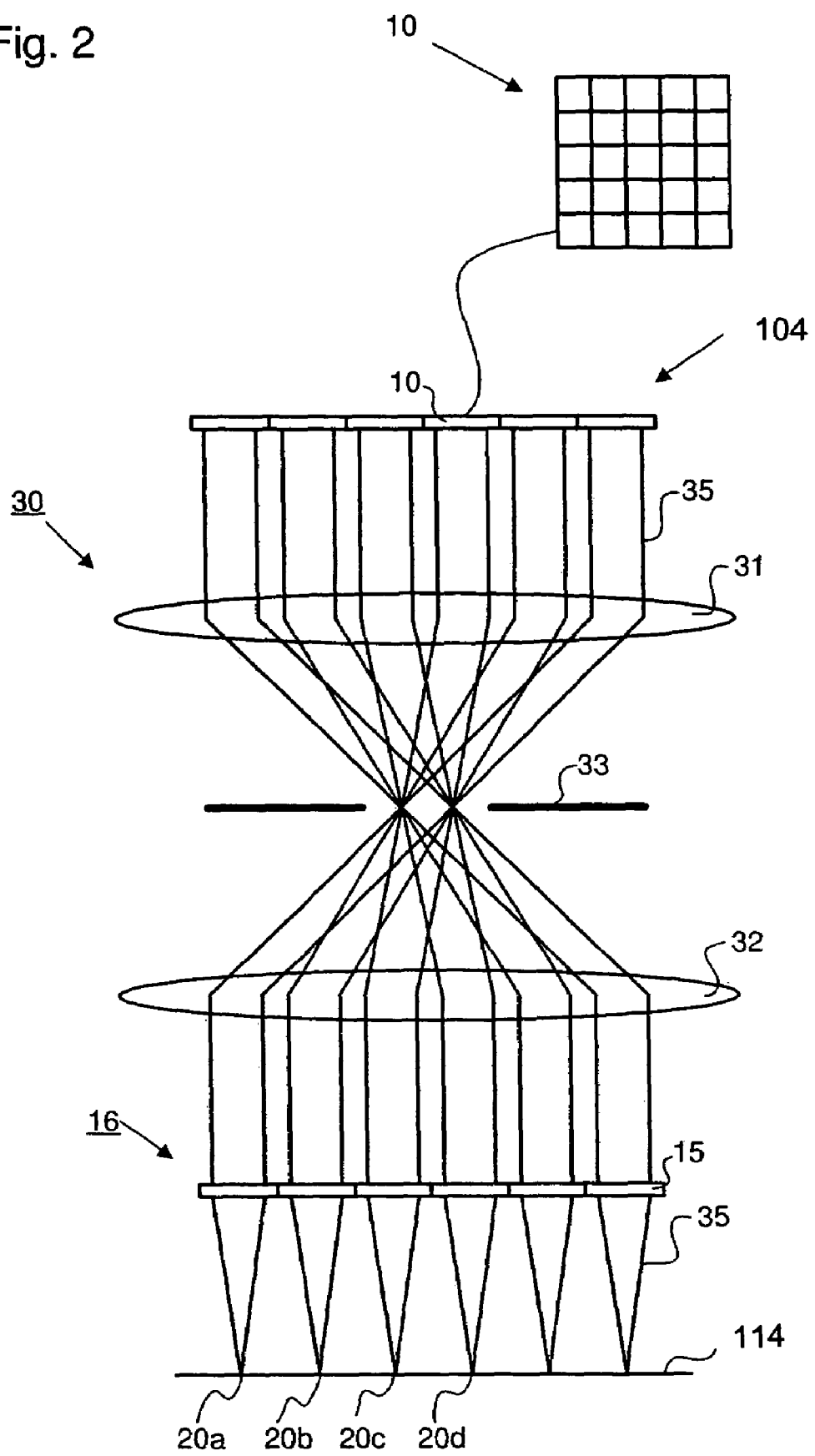
FIG. 2 depicts a side view of a portion of an array of individually controllable elements, micro-lens array and spot grid formed thereby according to an embodiment of the invention.

FIG. 2 shows an arrangement of an array of individually controllable elements 104, according to embodiments of the present invention. According to the arrangement shown, groups of elements in the array 104 are imaged together as a "super-pixel" 10. However, it remains within the scope of the invention to image single pixels separately rather than use super-pixels. Each (super-) pixel 10 produces sub-beams 35 of radiation, which pass through an optical system 30 shown for simplicity to consist of two simple lenses 31 and 32 with an aperture stop 33 located between the two. The aperture stop 33 in this position is necessary to reduce the level of unwanted radiation reaching the substrate 114. After passing through the optical system 30, the radiation from each (super-) pixel 10 impinges on a micro-lens 15 in a micro-lens array 16, which focuses each sub-beam 35 onto a localized region or "spot" (20a–20d) at the surface of the substrate 114. A typical configuration for a super-pixel 10 is shown in the figure and comprises a square grid of 5×5 elements. The intensity of each of the spots in the spot grid 20 thus formed is controlled for each flash of incident laser light by controlling the tilt of elements in the array of individually controllable elements 104 that make up each (super-) pixel 10.

The separation of spots in the spot grid 20 can be of the order of 300 microns, which is much larger than a typical critical dimension (CD) (a measure of the smallest feature that can be imaged), which is typically on the order of 3 microns. A denser pattern of localized exposures, the "exposed spot grid," is achieved by using a periodically flashing laser source and moving the substrate along a scan direction Y with one of the axes 22 of the rectangular spot grid offset by a small angle relative to the scan axis Y (see FIG. 3). According to the embodiment discussed, the laser is configured to flash at 50 kHz and the substrate is moved at a speed of 62.5 mm per second. The result is that localized exposures are separated in the Y direction by 1.25 microns. The separation in an X direction perpendicular to the scan direction Y depends on the angle that the spot grid makes relative to the scan axis Y. (These values, as well as those provided in other embodiments, are provided by way of example, not limitation.)

Figure 3:
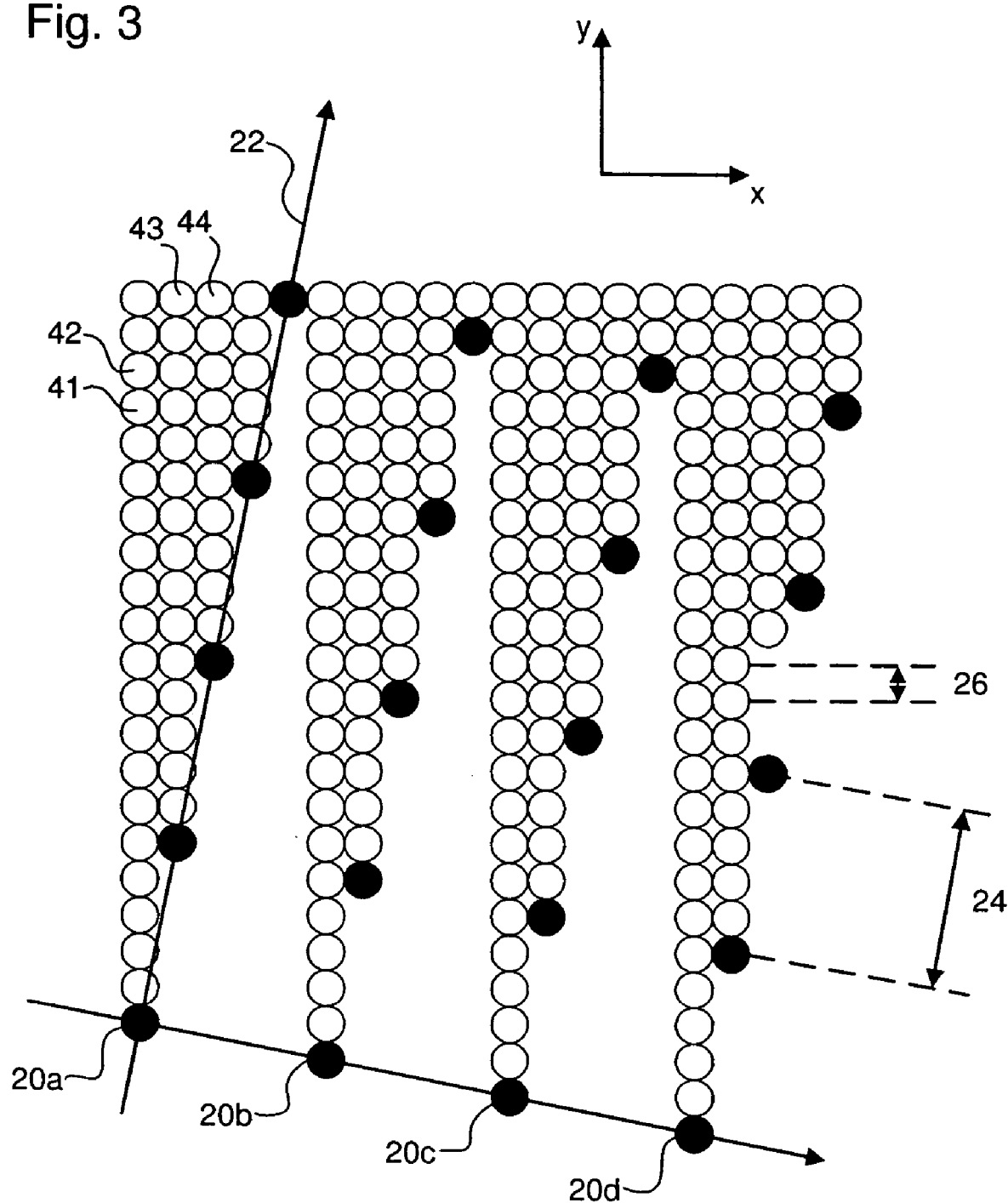
FIG. 3 depicts the formation of an exposed spot grid.

The arrangement is shown schematically in FIG. 3, which represents a snapshot in time for a spot-grid configured to produce a uniform dose-map or pattern on the substrate 114. The filled circles represent the positions of each of the spots in the spot grid at a given time while open circles represent spots that were written at earlier times (i.e., they represent "exposed spots," also referred to as "localized exposures," in the exposed spot grid). Although shown without overlap in the interest of clarity, the intensity profile of each spot would normally be arranged to overlap with its neighbors. The substrate 114 is moving upwards in the figure, along the Y-axis, relative to the projection system 108 and spot grid, which are held fixed relative to the page. The angle of axis 22 to the Y-axis has been exaggerated for clarity, a much smaller angle can be used for the working apparatus (the ratios of the spot separation 24 to the spot separation 26 would also be correspondingly much higher than that shown in the example). Spots 20a to 20d correspond to the focused beams numbered in the same way in FIG. 2, but viewed along axis 22.

The laser mode used according to an embodiment of the invention is $TEM_{00}$, which gives a Gaussian-shaped intensity profile that is maintained through the optical system all the way to the substrate 114. However, other laser modes and intensity profiles can also be used. A pattern of continuous intensity is achieved by arranging for neighboring spots to overlap. As mentioned above, the closest spot separation according to the embodiment described is 1.25 microns and a typical standard deviation of the Gaussian associated with each would be around 0.75 microns.

According to this arrangement, spots which are neighbors in the Y direction, such as spots 41 and 42, are imaged at relatively closely spaced times, separated by the period of the laser beam (0.02 ms). Spots that are neighbors in the X direction, such as spots 43 and 44, on the other hand, are imaged at quite different times. For example, in the case where the separation between spots in the spot grid is 320 microns, 256 flashes will be required with an exposed spot distance of 1.25 micrometers in order for the next neighbor in the X direction to be exposed.

As described above, a control signal is transmitted to the array 104 along a data path. The data path acts to convert a dose map or pattern of radiation requested by a user of the lithography apparatus to a signal that will cause the array 104 to produce the requested dose map on the substrate 114. In order to carry out this process, the data path comprises processing apparatus that includes a data manipulation device 50, depicted in FIG. 4, which is configured to analyze an incoming data stream comprising a (usually partly processed) version of the requested pattern and output the necessary signal to the array 104 or to devices that will process the data stream further before passing it on to the array 104. Part of the functionality of the data manipulation device 50 includes deciding for each pixel of the requested dose-map (which can, for example, be defined on a grid of points relative to the substrate 114) which super-pixels of the array 104 need to be actuated and to what extent. The data manipulation device 50 effectively calculates an optimal sub-beam intensity for each of the localized exposures to be made on the substrate 114. The requested dose-map is then built up over time from the array of localized exposures produced as the spot grid moves over the surface of the substrate 114. The process of providing the array 104 with the optimal sub-beam intensities is complicated by the fact that for each flash of the laser, each super-pixel causes (non-uniform) illumination of an area on the substrate 114 larger than one of the substrate grid elements so that for each localized exposure, the desired sub-beam intensity will depend on what dose map has been requested in a region surrounding the localized exposure.

The requested dose-map can be expressed as a column vector comprising elements that represent the required dose at each one of the grid positions on the substrate 114. The grid positions in the requested dose-map can be specified relative to their coordinates in the metrology frame coordinate system: $x_{MF}$, $y_{MF}$. As mentioned above, this requested dose-map is to be built up from a collection of exposed spots originating from the super-pixels in the array 104. Each of these spots will have a certain point-spread function that describes the cross-sectional spatial dependence of their intensity. In addition, there will be variations in the positions of each of the spots from their expected positions in the spot grid due to irregularities in the micro-lens array used to focus the spots. Both the spot positions and the spot point-spread function shapes can be input to the data manipulation device 50 via a calibration data storage device 52.

The process of forming an image in this way is referred to as pixel grid imaging. Mathematically, the requested dose-map is set to be equal to a sum over all possible exposed spots of a required intensity at each spot multiplied by a point-spread function for each spot. This can be written as the following equation:

$$D(x_{MF}, y_{MF}) = \sum_{n}^{all\ exposed spots} I_n \cdot PSF_n((x_{MF} - x_n), (y_{MF} - y_n)),$$

where $I_n$ represents the required individual exposed spot intensity for spot n, $PSF_n((x_{MF}-x_n), (y_{MF}-y_n))$ represents the point-spread function (the dose contribution at location $x_{MF}$, $y_{MF}$ of spot n), $x_n$ and $y_n$ indicate the position of an individual exposed spot and $D(x_{MF}, y_{MF})$ represents the requested dose-map.

The data manipulation device 50 is configured to solve the following problem: given the requested dose-map and the point-spread function information (which is provided as calibration data), what are the individual exposed spot intensities (or corresponding desired sub-beam intensities) that need to be provided to image the requested dose-map as accurately as possible? For each grid point on which the requested pattern is defined, the data manipulation device 50 has to receive and analyze data about the exposed spot intensities for a number of exposed spots in the region of the grid point. This information is in turn derived from the requested pattern in the region of the grid point. In general, a "context radius" can be defined about any given grid point in the requested pattern. The "context radius" defines the region of the requested pattern that is considered when calculating how to achieve the desired pattern at the grid point in question to a particular accuracy. The size of the context radius required will depend on the shape and positional deviation (from perfectly defined grid positions) of the point-spread function for the exposed spot grid. It will typically be chosen to be several times the standard deviation of the point spread function, which might therefore extend over several microns.

Figure 4:
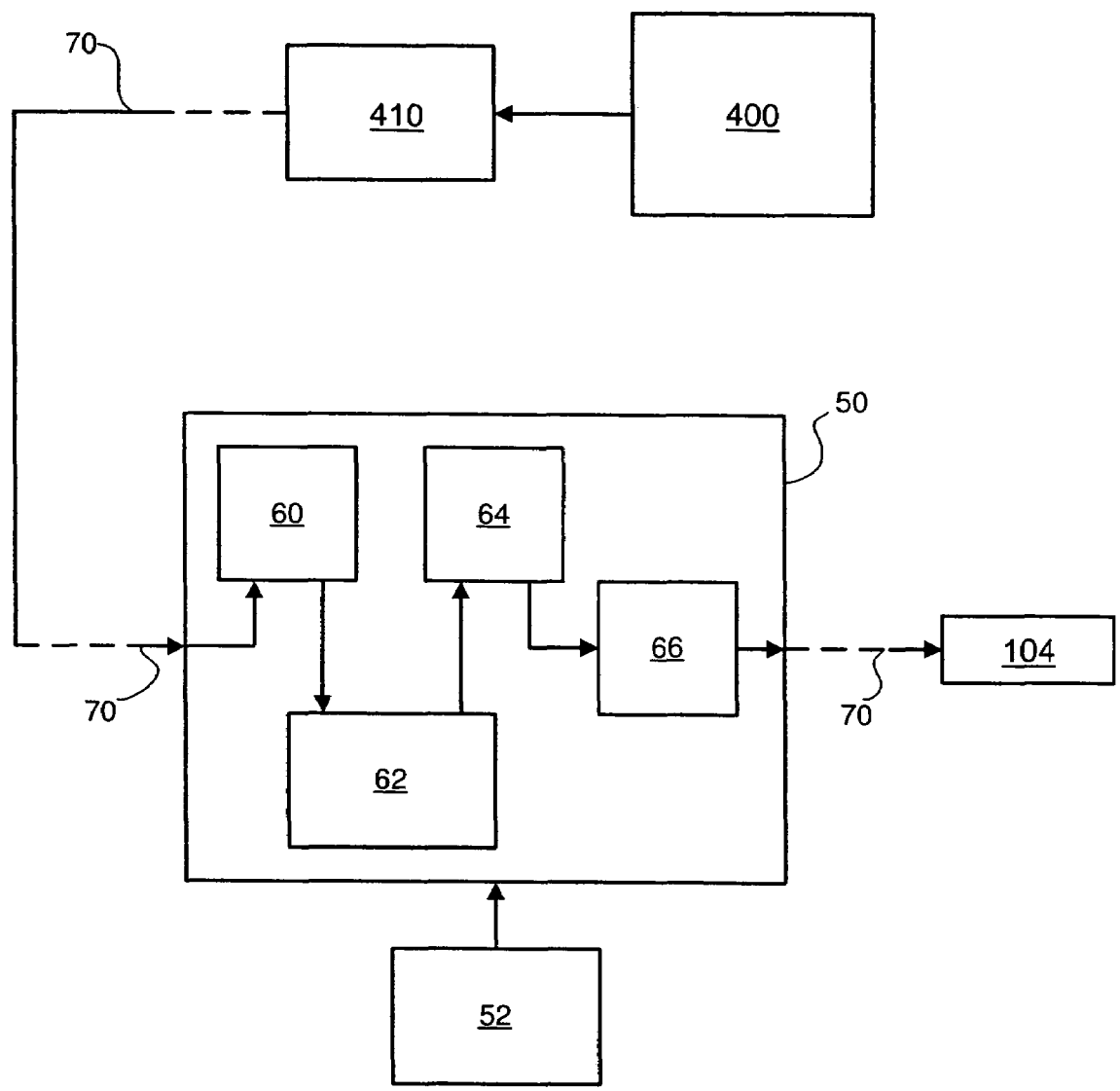
FIG. 4 depicts a data manipulation device in the data path.

In a typical application, the number of features to be written to the substrate is enormous and data representing the whole requested dose pattern will not be available at any one time to hardware in the data path feeding the array 104. As shown in FIG. 4, a rasterizer device 410 is provided that converts the descriptive representation of the desired pattern 400 input by a user into a sequence of data that substantially corresponds to a sequence of localized exposures to be formed on the substrate 114 (not necessarily the same sequence in which the localized exposures will actually be produced, as is further described below). Data representing the rasterized requested dose pattern is forwarded progressively over a period of time by the rasterizer 410 over the data path 70 until all of the requested pattern has been written onto the substrate 114. Broken line portions in the data path 70 represent sections which could comprise other data manipulation devices dealing with other aspects of the patterning process. As described above, the desired sub-beam intensity to apply for a given sub-beam at any one time is calculated taking as input the requested dose pattern within a context region around the position of the localized exposure concerned. This data is obtained from the rasterized sequence of data. The calculation for neighboring or nearby points will require similar (i.e., overlapping) context information but because these points are imaged at different times (particularly for points that are neighbors in the direction perpendicular to the scanning direction), this information will tend to be sent several times down the data path, contributing to the need for a large data bandwidth and limiting the speed with which the apparatus can operate.

FIG. 4 shows an arrangement according to an embodiment of the invention wherein the overlapping nature of context information for neighboring points (or nearby points relative to a context radius) can be exploited to reduce the overall bandwidth needed. A data manipulation device 50 is provided that comprises a first memory buffer 60 (comprising volatile memory such as RAM, for example), configured to store at least a portion of the requested dose map forwarded as a sequence of data by the rasterizer 410 and a desired sub-beam intensity calculation device 62, connected to the first memory buffer 60 and configured to calculate a desired (e.g., optimal) radiation intensity for each localized exposure (i.e., exposed spot) in the exposed spot grid. The memory buffer 60 stores data as it arrives at the data manipulation device 50 for a set period of time after which the data is expelled (e.g., written over). The memory buffer 60 provides the means by which the calculation device 62 can obtain overlapping context information a plurality of times without it having to be sent several times down the data path 70 from the rasterizer 410. The size of the memory buffer 60 (that determines the period over which it can store a given block of data sent from the rasterizer 410) can be chosen so that the requested dose pattern data for a given point on the substrate is available to the calculation device 62 for as long as it is relevant as context information (i.e., for as long as it takes the calculation device to output desired sub-beam intensities to the array 104 for those points potentially affected by the requested pattern at the point in question). It therefore depends on the size of the context radius or region on the requested dose pattern.

The data manipulation device can further comprise a second memory buffer 64 (comprising volatile memory such as RAM, for example), arranged to store the desired localized exposure intensities calculated by the calculation device 62, and a data re-ordering device 66 configured to build up a control signal from the results output by the calculation device 62 so as to provide the array 104 with the information necessary to actuate the appropriate elements of the array at the appropriate times.

The dual buffer arrangement is advantageous because it allows the exposed spot grid intensities to be calculated in an optimal way rather than being dictated by the order in which the localized exposures are actually produced on the substrate. This aspect is achieved by the second memory buffer 64, which allows the exposed spot grid intensity information to be re-ordered after the calculation, allowing more flexibility in the way the calculation is carried out. This improves the effectiveness with which context information can be re-used, potentially reducing the required bandwidth further and also decreasing the required size of the first memory buffer 60 and the efficiency with which data can be extracted from it.

Figure 5:
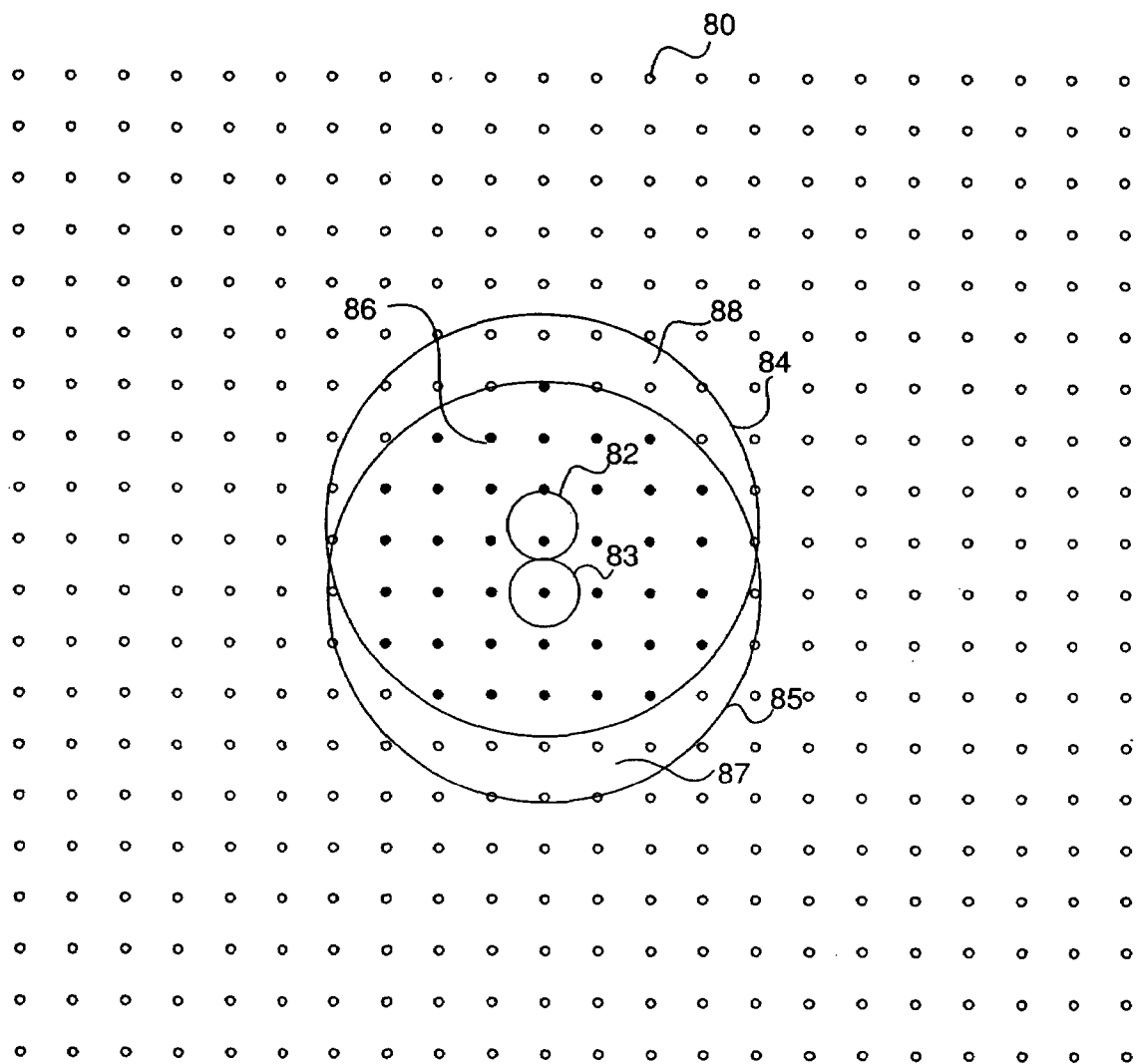
FIGS. 5 and 6 depict arrangements for using context information for adjacent localized exposures.
Figure 6:
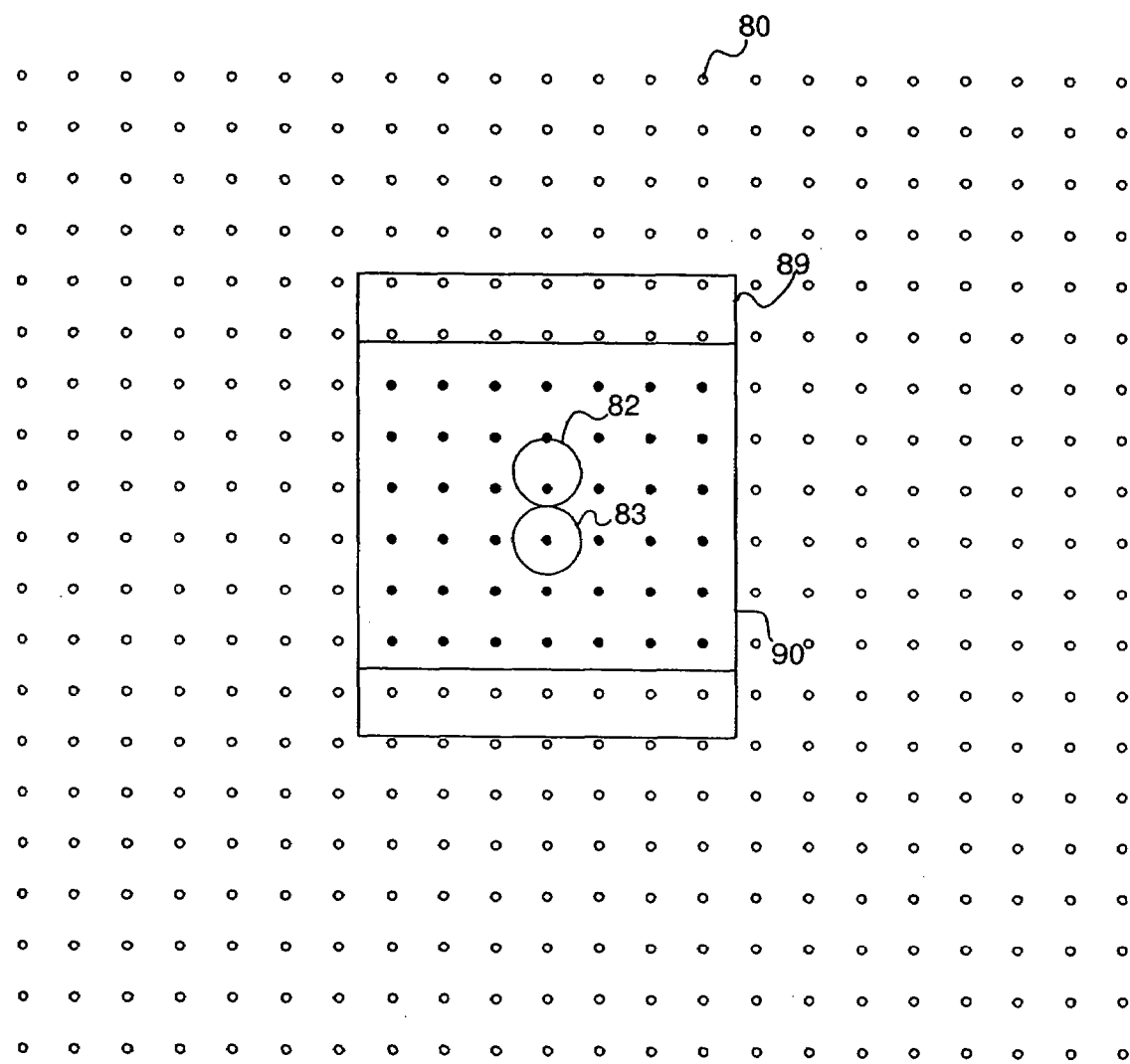

FIGS. 5 and 6 illustrate alternative arrangements for dealing with context information. FIG. 5 illustrates a grid of points 80 representing points at which the requested dose pattern can be defined. Circles 82 and 83 represent neighboring localized exposures either in a scanning direction Y or perpendicular to a scanning direction, for example. As mentioned above, the actual radiation dose distribution associated with each of the spots 82 and 83 will extend non-uniformly and overlap. Open circles that touch each other have been used for clarity to indicate the center of the localized exposure and the fact that these are nearest neighbor localized exposures in the sense that no other localized exposure will be centered at a position between exposures 82 and 83. Although nearest neighbors have been depicted here, the data manipulation device is configured to calculate desired sub-beam intensities for a plurality of neighboring localized exposures. "Neighboring" in this context means simply that sub-beam intensities are calculated for a group of localized exposures for which there is some shared context information and therefore savings to be made by including one or more buffers.

Each of the localized exposures 82 and 83 can be produced with an intensity that is calculated taking into account context information within a context radius of a center-point of the localized exposure on the substrate 114. The region of the requested dose-map forming the context information for localized exposures 82 and 83 are shown as circles 84 and 85 respectively. The region of intersection represents shared context information and the points involved 86 are depicted as filled circles rather than open circles.

The data manipulation device 50 according to the present embodiment can exploit this overlap in context data by calculating a portion of the exposed spot grid comprising a plurality of localized exposures all in one operation rather than having to calculate the intensity for each spot separately according to the order required by the array 104. This is made possible by the memory buffer 64 which allows the data to be re-ordered before it is sent to the array 104 as a control signal. The set of exposed spots to be treated together can be chosen so as to exploit best the shared context information and maximize the efficiency with which the calculation can be carried out. For example, in the case where a shift register memory device is used to provide the calculation device 62 with the appropriate portions of the requested dose map, it might be convenient to choose to calculate a row of spots one after another. This situation is illustrated in FIG. 5, for example. Here, it can be seen that the additional context information that needs to be considered moving from one exposed spot to the next is not that associated with an entire context radius but merely that associated with a reduced region 87. A shift register mechanism provides a convenient way of adding this extra data to that already stored in order to provide the calculation device 62 with the information necessary to carry out the calculation. Trailing data such as that falling in region 88 can be purged from the memory device if required. This arrangement avoids unnecessary re-transmission and re-writing of context information.

The context data can also be included using different shaped context regions. FIG. 6 shows an arrangement that can be particularly well implemented using the shift register mechanism discussed above. Here, rectangular context regions 89 and 90 are employed rather than the circular regions of 84 and 85 of FIG. 5. The rectangular regions can be more easily implemented as they correspond better to the geometry of the grid on which the requested dose map is defined.

The size of the memory buffer 64 for storing the data to be re-ordered required for this embodiment will depend on for how many points in the exposed spot grid the control signal is to be calculated in one go. In the case where an entire row is to be calculated, the depth of the memory buffer will be proportional to the length of the micro-lens array divided by the scan speed. This represents the time that elapses between producing the first localized exposure of the row and the final localized exposure of the row.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A lithography apparatus comprising:
a projection system configured to project a beam of radiation onto a substrate as an array of sub-beams of radiation;
an array of individually controllable elements configured to modulate said sub-beams of radiation so as substantially to form a requested dose pattern on said substrate, said requested dose pattern being built up over time from an array of localized exposures in which at least neighboring localized exposures are imaged at substantially different times and in which each localized exposure is produced by one of said sub-beams of radiation;
a rasterizer device arranged to convert data defining said requested dose pattern to a sequence of data representing a requested dose at a corresponding sequence of points within a pattern; and
a data manipulation device arranged to receive said sequence of data and constitute a control signal therefrom suitable for controlling said array of individually controllable elements, wherein said data manipulation device is configured to calculate a desired sub-beam intensity for each localized exposure so as to reproduce said requested dose pattern, said calculation being based for each localized exposure on context information comprising said requested dose pattern in a region on said substrate around said localized exposure, and wherein said data manipulation device includes
a memory buffer arranged to store at least a portion of said context information, wherein said portion of said context information includes at least a portion of said sequence of data; and
a desired sub-beam intensity calculation device configured to calculate said desired sub-beam intensity for the plurality of neighboring localized exposures based on said context information provided by said memory buffer.

2. The lithographic apparatus of claim 1, further comprising:
a second memory buffer, arranged to store results of calculations performed by said desired sub-beam intensity calculation device; and
a data re-ordering device configured to build said control signal from said stored results in such a way that desired sub-beam intensities are supplied to said array of individually controllable elements substantially in the order in which associated localized exposures are to be imaged.

3. The lithographic apparatus of claim 1, wherein a size of said portion of said sequence of data that is stored in said memory buffer is determined by an amount of said context information used in said desired sub-beam intensity calculation device.

4. The lithographic apparatus of claim 1, wherein said desired sub-beam intensity calculation device is configured to calculate the desired sub-beam intensities for at least two of said localized exposures in a row of said localized exposures defined along a direction perpendicular to a direction of movement of said substrate relative to said projection system before a first of said at least two localized exposures in said row are imaged.

5. The lithographic apparatus of claim 1, wherein said desired sub-beam intensity calculation device is configured to calculate the desired sub-beam intensities for an entire row of said localized exposures of a portion of said pattern on which the data manipulation device operates, defined along a direction perpendicular to a direction of movement of said substrate relative to said projection system, before a first localized exposure of said entire row of localized exposures is imaged.

6. The lithographic apparatus of claim 1, wherein said memory buffer comprises a shift register.

7. The lithography apparatus of claim 1, wherein said data manipulation device is configured to calculate said control signal during imaging, and wherein said memory buffer is accessible to said data manipulation device during imaging.

8. A device manufacturing method, comprising:
projecting a beam of radiation onto a substrate as an array of sub-beams of radiation;
modulating the sub-beams of radiation with an array of individually controllable elements so as substantially to form a requested dose pattern on the substrate, the requested dose pattern being built up over time from an array of localized exposures in which at least neighboring localized exposures are imaged at substantially different times and in which each localized exposure is produced by one of the sub-beams of radiation;
converting data defining the requested dose pattern to a sequence of data representing a requested dose at a corresponding sequence of points within a pattern;
receiving the sequence of data at a data manipulation device;
constituting a control signal at the data manipulation device suitable for controlling the array of individually controllable elements; and
calculating at the data manipulation device a desired sub-beam intensity for each localized exposure so as to reproduce the requested dose pattern, the calculation being based for each localized exposure on context information comprising the requested dose pattern in a region on the substrate around the localized exposure, the data manipulation device including
a memory buffer arranged to store at least a portion of the context information, wherein the portion of the context information includes at least a portion of the sequence of data; and
a desired sub-beam intensity calculation device configured to calculate the desired sub-beam intensity for the plurality of neighboring localized exposures based on the context information provided by the memory buffer.

9. The method of claim 8, further comprising:
storing at least a portion of the context information, wherein the portion of the context information includes at least a portion of the sequence of data.

10. The method of claim 8, further comprising:
calculating the desired sub-beam intensity for the plurality of neighboring localized exposures based on the context information provided by the memory buffer.

* * * * *